(12) United States Patent
Chen et al.

(10) Patent No.: US 12,708,049 B2
(45) Date of Patent: Aug. 11, 2026

(54) SEMICONDUCTOR PACKAGE AND METHOD

(71) Applicant: Taiwan Semiconductor Manufacturing Co., Ltd., Hsinchu (TW)

(72) Inventors: Hsien-Wei Chen, Hsinchu (TW); Sung-Feng Yeh, Taipei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 245 days.

(21) Appl. No.: 18/448,220

(22) Filed: Aug. 11, 2023

(65) Prior Publication Data

US 2025/0054926 A1 Feb. 13, 2025

(51) Int. Cl.
*H01L 21/78* (2006.01)
*H10P 72/70* (2026.01)
(Continued)

(52) U.S. Cl.
CPC ............ *H10W 90/00* (2026.01); *H10P 72/74* (2026.01); *H10W 70/65* (2026.01); *H10W 70/685* (2026.01); *H10W 74/016* (2026.01); *H10W 74/111* (2026.01); *H10W 74/43* (2026.01); *H10W 74/47* (2026.01);
(Continued)

(58) Field of Classification Search
CPC ... H01L 25/16; H01L 21/565; H01L 21/6835; H01L 23/291; H01L 23/293; H01L 23/3107; H01L 23/49822; H01L 23/49838; H01L 24/08; H01L 24/80; H01L 2224/08238; H01L 2224/80895; H01L 2224/80896; H01L 2924/19011; H01L 2924/19102; H01L 2221/68359; H01L 2225/06541; H01L 21/568; H01L 23/3128; H01L 23/49816; H01L 23/5383; H01L 23/5385; H01L 25/50; H01L 2221/68345;
(Continued)

(56) References Cited

U.S. PATENT DOCUMENTS 8,975,726 B2 * 3/2015 Chen ................ H01L 21/76885 257/532
8,993,380 B2 3/2015 Hou et al.
(Continued)

FOREIGN PATENT DOCUMENTS

TW 202115858 A 4/2021
TW 202119570 A 5/2021
(Continued)

*Primary Examiner* — Vu A Vu
(74) *Attorney, Agent, or Firm* — Slater Matsil, LLP

(57) ABSTRACT

A semiconductor package with two interposers, and the method of forming the same are provided. The semiconductor package may include a first interposer, a first semiconductor die on the first interposer, a second interposer on the first semiconductor die, and a second semiconductor die on the second interposer. The second interposer may be between the first semiconductor die and the second semiconductor die. The first semiconductor die may be bonded to the first interposer by metal-to-metal bonding and dielectric-to-dielectric bonding. The second semiconductor die may be bonded to the second interposer by metal-to-metal bonding and dielectric-to-dielectric bonding.

20 Claims, 12 Drawing Sheets

(51) Int. Cl.

| | |
|---|---|
| ***H10W 70/65*** | (2026.01) |
| ***H10W 70/685*** | (2026.01) |
| ***H10W 74/01*** | (2026.01) |
| ***H10W 74/10*** | (2026.01) |
| ***H10W 74/43*** | (2026.01) |
| ***H10W 74/47*** | (2026.01) |
| ***H10W 90/00*** | (2026.01) |
| *H10W 80/00* | (2026.01) |

(52) U.S. Cl.
CPC ........ *H10W 80/312* (2026.01); *H10W 80/327* (2026.01); *H10W 90/794* (2026.01)

(58) Field of Classification Search
CPC ............. H01L 23/5389; H01L 25/0652; H01L 25/0655; H01L 25/18
USPC .......................................................... 257/678
See application file for complete search history.

(56) References Cited

U.S. PATENT DOCUMENTS

| | | | | |
|---|---|---|---|---|
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 * | 10/2016 | Tsai | H01L 21/6835 |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 10,535,632 | B2 * | 1/2020 | Jeng | H01L 24/20 |
| 10,784,220 | B2 * | 9/2020 | Jeng | H01L 24/08 |
| 10,804,242 | B2 * | 10/2020 | Yu | H01L 23/49838 |
| 11,101,240 | B2 * | 8/2021 | Chung | H01L 25/105 |
| 11,296,032 | B2 * | 4/2022 | Tsou | H01L 23/49838 |
| 11,710,701 | B2 * | 7/2023 | Kim | H01L 21/565 257/668 |
| 11,824,040 | B2 * | 11/2023 | Wu | H01L 23/16 |
| 12,334,445 | B2 * | 6/2025 | Kang | H01L 21/6835 |
| 2021/0098381 | A1 * | 4/2021 | Yu | H01L 23/42 |
| 2023/0073026 | A1 | 3/2023 | Elsherbini et al. | |
| 2023/0086691 | A1 | 3/2023 | Srinivasan et al. | |
| 2023/0161120 | A1 | 5/2023 | Yu et al. | |
| 2023/0187407 | A1 | 6/2023 | Molnar et al. | |
| 2023/0215839 | A1 | 7/2023 | Lin et al. | |
| 2023/0299049 | A1 * | 9/2023 | Deshpande | H01L 23/481 |
| 2023/0307345 | A1 | 9/2023 | Hou et al. | |
| 2023/0411263 | A1 | 12/2023 | Park et al. | |
| 2024/0178103 | A1 * | 5/2024 | Wu | H01L 23/5226 |

FOREIGN PATENT DOCUMENTS

| | | | |
|---|---|---|---|
| TW | 202314964 | A | 4/2023 |
| TW | 202322303 | A | 6/2023 |
| TW | 202329369 | A | 7/2023 |
| TW | 202329391 | A | 7/2023 |
| TW | 202339138 | A | 10/2023 |
| TW | 202418546 | A | 5/2024 |

* cited by examiner 402
280'
T3
T2
T1
200
210
112
110
150
100
50
310
304
306
308
256
254
300

SEMICONDUCTOR PACKAGE AND METHOD

BACKGROUND

The formation of integrated circuits includes forming integrated circuit devices on semiconductor wafers, and then sawing the semiconductor wafers into device dies. The device dies may be bonded to package components such as interposers, package substrates, printed circuit boards, or the like. To protect the device dies and the bonding structures that bond a device die to a package component, an encapsulant such as a molding compound, an underfill, or the like, may be used to encapsulate the device dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
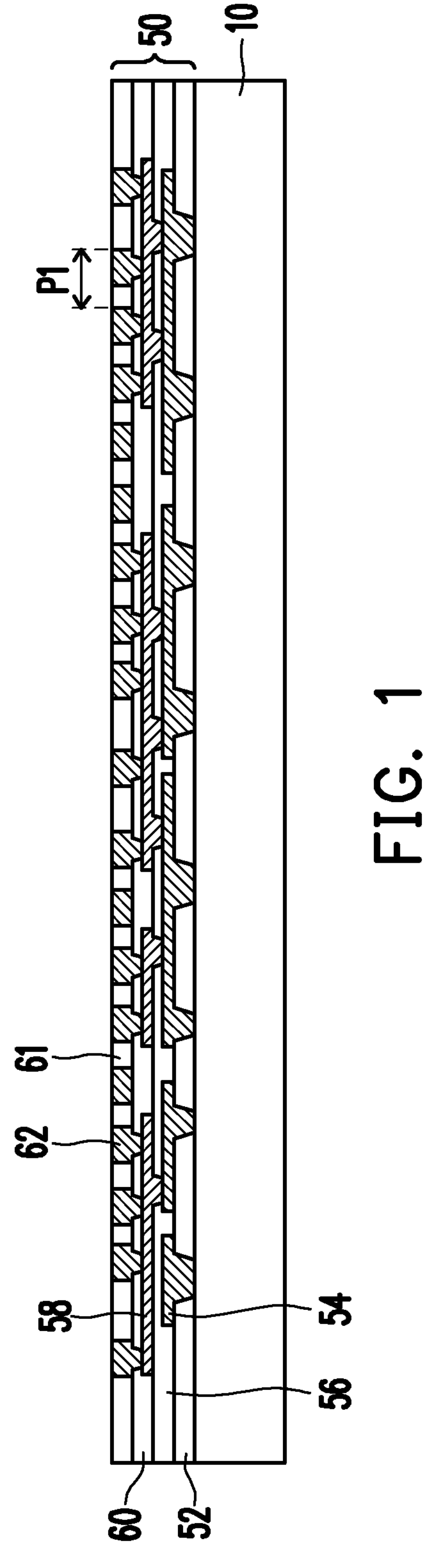
FIGS. 1, 2, 3, 4, 5, 6, 7, 8, 9, and 10 illustrate cross-sectional views of intermediate stages in the manufacturing of a semiconductor package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “underlying,” “below,” “lower,” “overlying,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package having multiple tiers of interposers with one or more dies on each interposer and the method of forming the same are provided. In accordance with some embodiments, one or more bottom integrated circuit dies are bonded and electrically connected to a bottom interposer by dielectric-to-dielectric and metal-to-metal bonding. A top interposer is disposed on and electrically connected to the bottom integrated circuit dies, and one or more top integrated circuit dies are bonded and electrically connected to the top interposer by dielectric-to-dielectric and metal-to-metal bonding. The bonding mechanism between the integrated circuit dies and the interposers may allow for a larger density of the conductive features that electrically connect the integrated circuit dies to the interposers. Further, the interposers may reduce die-to-die routing distance among the integrated circuit dies. As a result, the signal integrity, the power integrity, and the overall performance of the semiconductor package during operation may be improved.

FIG. 1 illustrates a bottom interposer 50, which may be a build-up interposer, formed on a first carrier 10. The bottom interposer 50 may be bonded to integrated circuit dies in subsequent processes. As a result, the integrated circuit dies may be electrically connected to one another by the bottom interposer 50. The first carrier 10 may be a semiconductor carrier, a glass carrier, a ceramic carrier, or the like. The first carrier 10 may have a round top-view shape, and may have a size of a silicon wafer. The bottom interposer 50 may comprise one or more dielectric layer(s) and respective conductive features(s) in one or more dielectric layer(s). In the embodiment illustrated in FIG. 1, the bottom interposer 50 comprises a dielectric layer 52, a dielectric layer 56 on the dielectric layer 52, a dielectric layer 60 on the dielectric layer 56, and a dielectric layer 61 on the dielectric layer 60. The bottom interposer 50 further comprises conductive features 54 in the dielectric layer 52 and the dielectric layer 56, conductive features 58 in the dielectric layer 56 and the dielectric layer 60, and conductive features 62 in the dielectric layer 60 and the dielectric layer 61. FIG. 1 illustrates the bottom interposer 50 with four dielectric layers as an example. In some embodiments, the bottom interposer 50 has less or more than four dielectric layers.

The conductive features 54 and the conductive features 58 may be redistribution lines and may comprise via portions and line portions. The via portions of the conductive features 58 may be in direct contact with and electrically connected to the line portions of the conductive features 54. The conductive features 62 may be bonding pads. Some of the conductive features 62 may comprise via portions and pad portions. The via portions of the conductive features 62 may be in direct contact with and electrically connected to the line portions of the conductive features 58. Some of the conductive features 62 may comprise pad portions without via portions and may be dummy bonding pads that may be electrically isolated from the circuitry of the bottom interposer 50.

The dielectric layer 61 may be a bonding layer and the pad portions of the conductive features 62 may be bonding pads, which may be bonded to integrated circuit dies in subsequent processes. The material of the dielectric layer 61 and the material of the conductive features 62 may be selected to be suitable to bond with integrated circuit dies in subsequent processes. In some embodiments, the dielectric layers of the bottom interposer 50 comprise a same or similar dielectric material(s), such as an inorganic dielectric material (e.g., silicon oxide, silicon nitride, silicon carbide, silicon oxynitride, silicon oxycarbide, silicon oxycarbonitride, or the like). In some embodiments, the conductive features of the bottom interposer 50 comprise a same or similar conductive material(s), such as aluminum, nickel, copper, titanium, tungsten, or the like.

Each dielectric layer of the bottom interposer 50 may be formed by a suitable deposition process, such as chemical vapor deposition (CVD), atomic layer deposition (ALD), or the like. Each layer of the conductive features of the bottom interposer 50 may be formed by a damascene process, such as a single damascene process, a dual damascene process, or the like. After the conductive features 62 are formed in the dielectric layer 61 and the dielectric layer 60, a planarization process may be performed on top surfaces of the conductive features 62 and the dielectric layer 61. As a result, top surfaces of the conductive features 62 and the dielectric layer 61 are substantially coplanar or level within process variations. The planarization process may be a chemical-mechanical polish (CMP), a grinding process, an etch-back process, combinations thereof, or the like. The pad portions of the conductive features 62 may be used to bond with integrated circuit dies in subsequent processes and may have a pitch P1 smaller than about 10 μm. The small value of the pitch P1 may correspond to a large density of the conductive features 62, which may improve the signal integrity, the power integrity, and the overall performance of the complete semiconductor package during operation.

Figure 2:
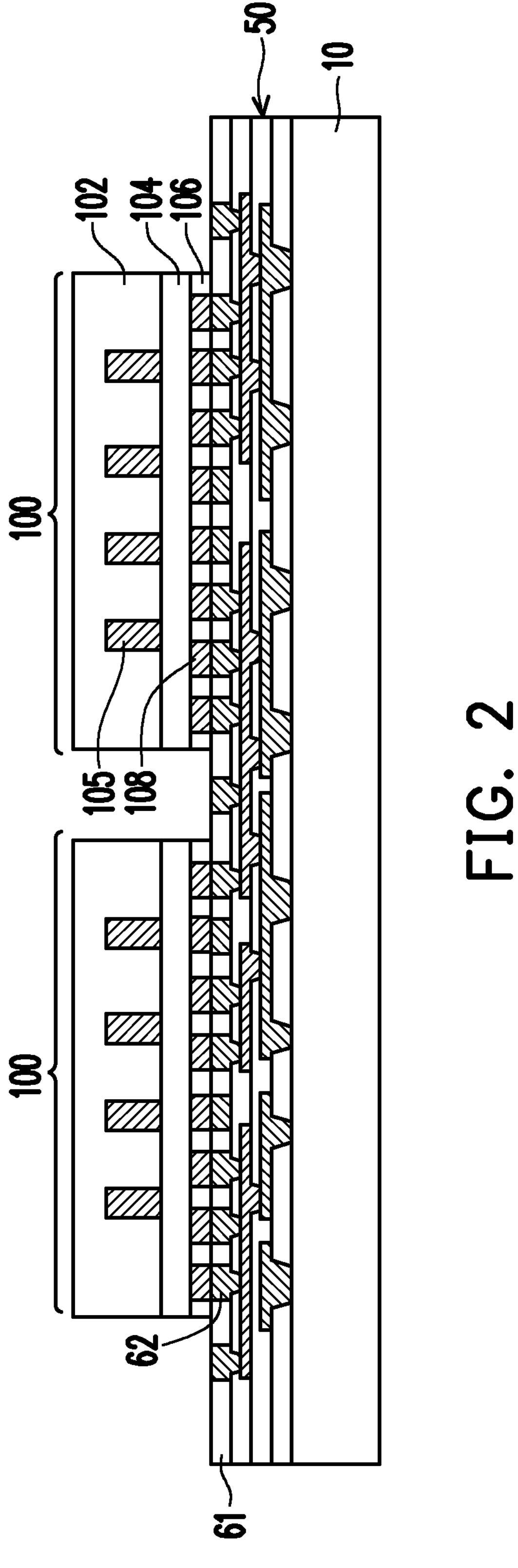

In FIG. 2, bottom integrated circuit dies 100 are bonded to the bottom interposer 50. Each bottom integrated circuit die 100 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, high bandwidth memory (HBM) die etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), a deep trench capacitor (DTS) die, the like, or combinations thereof.

Each bottom integrated circuit die 100 may have a semiconductor substrate 102, such as silicon, doped or undoped, or an active layer of a semiconductor-on-insulator (SOI) substrate. The semiconductor substrate 102 may include other semiconductor materials, such as germanium, silicon carbide, gallium arsenic, gallium phosphide, indium phosphide, indium arsenide, indium antimonide, SiGe, GaAsP, AlInAs, AlGaAs, GaInAs, GaInP, and/or GaInAsP, or combinations thereof. Other materials, such as multi-layered or gradient materials, may also be used for the semiconductor substrate 102. The semiconductor substrate 102 may have an active surface (e.g., the surface facing downwards in FIG. 2), which may be called a front side, and an inactive surface (e.g., the surface facing upwards in FIG. 2), which may be called a back side. The front side of the semiconductor substrate 102 may correspond to an active side or a front side of the bottom integrated circuit die 100.

Devices (not separately illustrated) may be disposed at the active surface of the semiconductor substrate 102. The devices may be active devices (e.g., transistors, diodes, etc.), capacitors, resistors, or the like. An interconnect structure 104 may be disposed over the active surface of the semiconductor substrate 102. The interconnect structure 104 may interconnect the devices to form an integrated circuit. The interconnect structure 104 may comprise metallization patterns (not separately shown) in dielectric layers (not separately shown). The dielectric layers may be low-k dielectric layers. The metallization patterns may include metal lines and vias, which may be formed in the dielectric layers by a damascene process, such as a single damascene process, a dual damascene process, or the like. The metallization patterns may be formed of a suitable conductive material, such as copper, tungsten, aluminum, silver, gold, a combination thereof, or the like. The metallization patterns may be electrically connected to the devices. Conductive vias 105 may be disposed in the semiconductor substrate 102. The conductive vias 105 may be electrically connected to the metallization patterns of the interconnect structure 104. The semiconductor substrate 102 may be thinned in a subsequent process to expose the conductive vias 105 at the inactive surface of the semiconductor substrate 102. After the thinning process, the conductive vias 105 may be through-substrate vias (TSV), such as through-silicon vias.

A bonding layer 106 may be disposed on the interconnect structure 104 at the front side of each bottom integrated circuit die 100. The bonding layer 106 may be formed of a dielectric material, such as silicon oxide, silicon nitride, silicon carbide, silicon oxynitride, silicon oxycarbide, silicon oxycarbonitride, or the like. In some embodiment, the bonding layer 106 of the bottom integrated circuit dies 100 and the dielectric layer 61 of the bottom interposer 50 comprise a same material. The bonding layer 106 may be formed by a suitable deposition process, such as CVD, ALD, or the like. One or more passivation layer(s) (not separately illustrated) may be disposed between the bonding layer 106 and the interconnect structure 104. Die connectors 108 may extend through the bonding layer 106. The die connectors 108 may include conductive pillars, pads, or the like, to which external connections can be made. In some embodiments, the die connectors 108 include bonding pads at the front side of the bottom integrated circuit die 100 and vias that connect the bonding pads to the metallization pattern of the interconnect structure 104. The die connectors 108, including the bonding pads and the vias, may be formed by a damascene process, such as a single damascene process, a dual damascene process, or the like. The die connectors 108 may be formed of a conductive material, such as aluminum, nickel, copper, titanium, tungsten, or the like. In some embodiment, the die connectors 108 and the conductive features 62 comprise a same material.

The bottom integrated circuit dies 100 may be bonded to the bottom interposer 50 by placing the bottom integrated circuit dies 100 using a pick-and-place process or the like, then bonding the bottom integrated circuit dies 100 to the dielectric layer 61 and some of the conductive features 62. The bonding layers 106 of the bottom integrated circuit dies 100 may be directly bonded to the dielectric layer 61 through dielectric-to-dielectric bonding, and the die connectors 108 of the bottom integrated circuit dies 100 may be directly bonded to respective conductive features 62 through metal-to-metal bonding.

The bonding may include a pre-bonding and an annealing. During the pre-bonding, a small pressing force may be applied to press the bottom integrated circuit dies 100 against the bottom interposer 50. The pre-bonding may be performed at a low temperature, such as room temperature. After the pre-bonding, the bonding layers 106 may be bonded to the dielectric layer 61. The bonding strength may be then improved in a subsequent annealing step at a higher temperature. After the annealing, direct bonds such as dielectric-to-dielectric bonds may be formed between the bonding layers 106 to the dielectric layer 61. The die connectors 108 may be bonded to the conductive features 62 with a one-to-one correspondence. The die connectors 108 may be in direct contact with the conductive features 62 after the pre-bonding, or may expand to be brought into direct contact with the conductive features 62 during the annealing. Further, during the annealing, the material of the die connectors 108 may intermingle or bond with the material of the conductive features 62, so that metal-to-metal bonds are formed.

Figure 3:
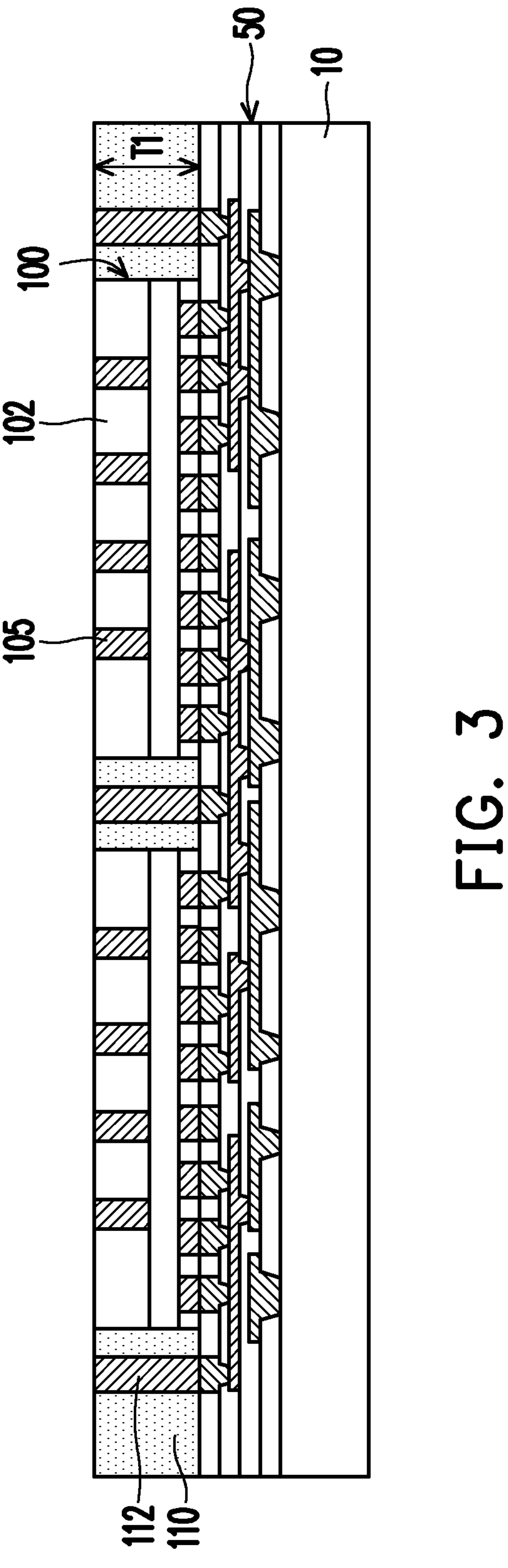

In FIG. 3, a bottom gap-fill layer 110 is formed on the bottom interposer 50 surrounding the bottom integrated circuit dies 100, through vias 112 are formed on the bottom interposer 50 and through the bottom gap-fill layer 110, and the semiconductor substrates 102 of the bottom integrated circuit dies 100 are thinned to expose the conductive vias 105. The bottom gap-fill layer 110 may be also referred to as an encapsulant. The bottom gap-fill layer 110 may be along sidewalls of the bottom integrated circuit dies 100. The bottom gap-fill layer 110 may be formed of a dielectric material. In some embodiments, the dielectric material of the bottom gap-fill layer 110 comprises an inorganic dielectric material, such as a silicon-based dielectric material (e.g., silicon oxide, silicon nitride, silicon carbide, silicon oxynitride, silicon oxycarbide, silicon oxycarbonitride, or the like), which may be formed by a suitable deposition process, such as CVD, ALD, or the like. In some embodiments, dielectric material of the bottom gap-fill layer 110 comprises an organic dielectric material, such as a polymer-based dielectric material (e.g., molding compound, epoxy, resin, or the like), which may be formed by a suitable molding process, such as compression molding, transfer molding, or the like. Initially, the bottom gap-fill layer 110 may cover the back sides of the bottom integrated circuit dies 100. A first thinning process may be performed to remove the excess bottom gap-fill layer 110 and portions of the semiconductor substrates 102 to expose the conductive vias 105. The first thinning process may a CMP process, a grinding process, an etch-back process, combinations thereof, or the like.

The through vias 112 are formed through the bottom gap-fill layer 110 to be in direct contact with and electrically connected to some of the conductive features 62 of the bottom interposer 50 that are not covered by the bottom integrated circuit dies 100. The through vias 112 may be formed of one or more layers of a conductive material, such as aluminum, nickel, copper, titanium, tungsten, or the like, and by a damascene process, such as a single damascene process, a dual damascene process, or the like, and may include various barrier layers, liner layers, or the like. The embodiments in which the bottom gap-fill layer 110 is formed before the through vias 112 are provided as examples. In other embodiments, the bottom gap-fill layer 110 is formed after the through vias 112. A second thinning process may be performed to planarize surface of the bottom gap-fill layer 110, surfaces of the through vias 112, and the back sides of the bottom integrated circuit dies 100. The second thinning process may be, a CMP, a grinding process, an etch-back process, combinations thereof, or the like. After the second thinning process, the surfaces of the bottom gap-fill layer 110, the through vias 112, the semiconductor substrates 102, and the conductive vias 105 are substantially coplanar or level within process variations. The embodiments in which the portions of the semiconductor substrates 102 are removed to expose the conductive vias 105 during the first thinning process are provided as examples. In other embodiments, the portions of the semiconductor substrates 102 are removed to expose the conductive vias 105 during the second thinning process. The bottom gap-fill layer 110 and the bottom integrated circuit dies 100 may have a same thickness T1 in a range of about 15 μm to about 30 μm.

Figure 4:
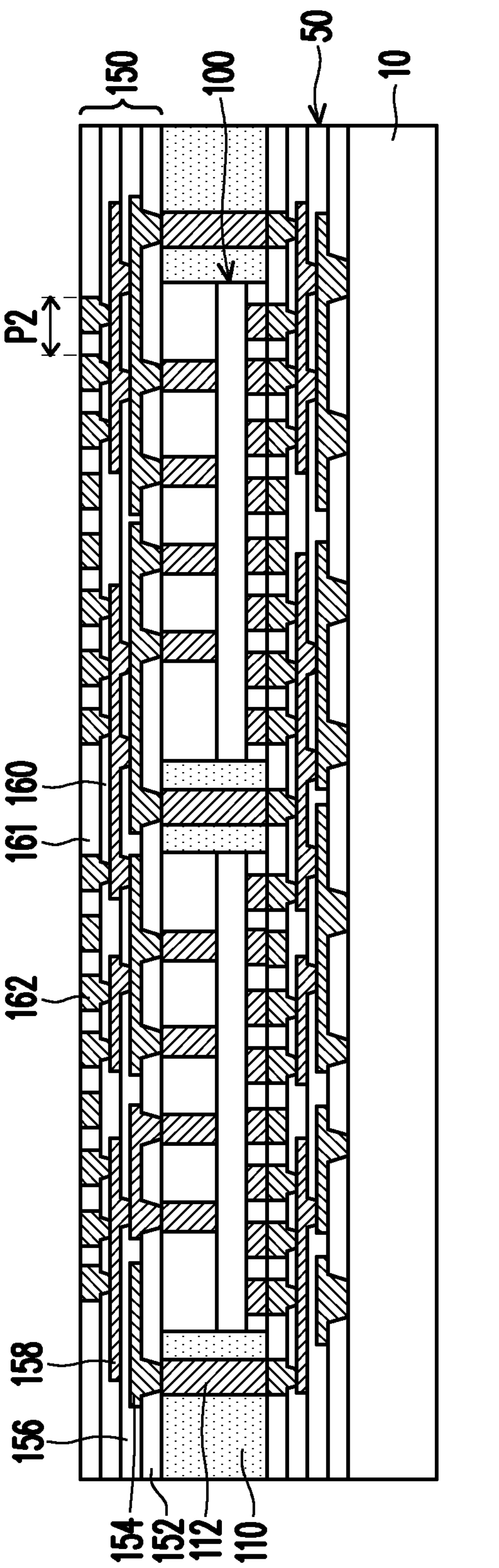

In FIG. 4, a top interposer 150, which may be a build-up interposer, is formed on the bottom integrated circuit dies 100, the through vias 112, and the bottom gap-fill layer 110. A bottom side of the top interposer 150 may be electrically connected to the bottom integrated circuit dies 100 and the through vias 112. A top side of the top interposer 150 may be bonded to other integrated circuit dies in subsequent processes. As a result, the integrated circuit dies on both sides of the top interposer 150 are electrically connected to one another by the top interposer 150 and the top interposer 150, and the bottom interposer 50 are electrically connected by the bottom integrated circuit dies 100 and the through vias 112. The top interposer 150 may comprise one or more dielectric layer(s) and respective conductive features(s) in one or more dielectric layer(s). In the embodiment illustrated in FIG. 4, the top interposer 150 comprises a dielectric layer 152, a dielectric layer 156 on the dielectric layer 152, a dielectric layer 160 on the dielectric layer 156, and a dielectric layer 161 on the dielectric layer 160. The top interposer 150 further comprises conductive features 154 in the dielectric layer 152 and the dielectric layer 156, conductive features 158 in the dielectric layer 156 and the dielectric layer 160, and conductive features 162 in the dielectric layer 160 and the dielectric layer 161. FIG. 4 illustrates the top interposer 150 with four dielectric layers as an example. In some embodiments, the top interposer 150 has less or more than four dielectric layers.

The conductive features 154 and the conductive features 158 may be redistribution lines and may comprise via portions and line portions. The via portions of the conductive features 154 may be in direct contact with and electrically connected to the through vias 112 and the conductive vias 105 of the bottom integrated circuit dies 100. The via portions of the conductive features 158 may be in direct contact with and electrically connected to the line portions of the conductive features 154. The conductive features 162 may be bonding pads. Some of the conductive features 162 may comprise via portions and pad portions. The via portions of the conductive features 162 may be in direct contact with and electrically connected to the line portions of the conductive features 158. Some of the conductive features 162 may comprise pad portions without via portions and may be dummy bonding pads that may be electrically isolated from the circuitry of the top interposer 150.

The dielectric layer 161 may be a bonding layer and the pad portions of the conductive features 162 may be bonding pads, which may be bonded to integrated circuit dies in subsequent processes. The material of the dielectric layer 161 and the material of the conductive features 162 may be selected to be suitable to bond with integrated circuit dies in subsequent processes. The dielectric layers of the top interposer 150 may comprise same or similar materials and may be formed by same or similar methods as described above with respect to the dielectric layers of the bottom interposer 50. The conductive features of the top interposer 150 may comprise same or similar materials and may be formed by same or similar methods as described above with respect to the conductive features of the bottom interposer 50.

After the conductive features 162 are formed in the dielectric layer 161 and the dielectric layer 160, a planarization process may be performed on top surfaces of the conductive features 162 and the dielectric layer 161. As a result, the top surfaces of the conductive features 162 and the dielectric layer 161 are substantially coplanar or level within process variations. The planarization process may be a CMP, a grinding process, an etch-back process, combinations thereof, or the like. The pad portions of the conductive features 162 may be used to bond with integrated circuit dies in subsequent processes and may have a pitch P2 smaller than about 10 μm. The small value of the pitch P2 may correspond to a large density of the conductive features 162, which may improve the signal integrity, the power integrity, and the overall performance of the complete semiconductor package during operation.

Figure 5:
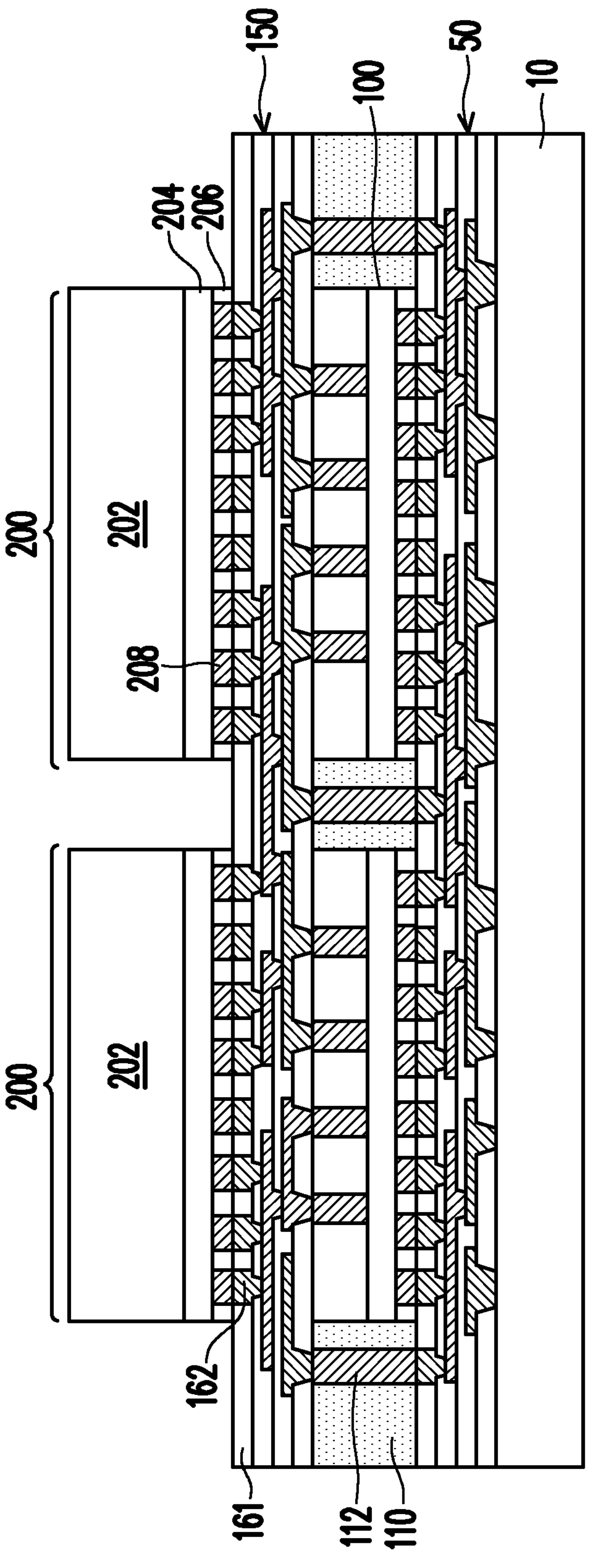

In FIG. 5, top integrated circuit dies 200 are bonded to the top interposer 150. In the embodiment illustrated in FIG. 5, the layout where two top integrated circuit dies 200 may overlap two bottom integrated circuit dies 100 is provided as an example, other layouts with different numbers of the top integrated circuit dies 200 and bottom integrated circuit dies 100 are contemplated. Each top integrated circuit die 200 may be a logic die (e.g., CPU, GPU, SoC, AP, microcontroller, etc.), a memory die (e.g., DRAM die, SRAM die, HBM die, etc.), a power management die (e.g., PMIC die), a RF die, a sensor die, a MEMS die, a signal processing die (e.g., DSP die), a front-end die (e.g., AFE die), a DTS die, the like, or combinations thereof. The materials and manufacturing methods of the features in the top integrated circuit dies 200 may be found by referring to the like features in the bottom integrated circuit dies 100. Each top integrated circuit die 200 may include a semiconductor substrate 202, which may have an active surface (e.g., the surface facing downwards in FIG. 5), which may be called a front side, and an inactive surface (e.g., the surface facing upwards in FIG. 5), which may be called a back side. The front side of the semiconductor substrate 202 may correspond to an active side or a front side of the top integrated circuit die 200. Devices (not separately illustrated) may be disposed at the active surface of the semiconductor substrate 202. The devices may be active devices (e.g., transistors, diodes, etc.), capacitors, resistors, or the like. An interconnect structure 204 may be disposed on the active surface of the semiconductor substrate 202.

A bonding layer 206 may be disposed on the interconnect structure 204, at the front side of the top integrated circuit die 200. One or more passivation layer(s) (not separately illustrated) may be disposed between the bonding layer 206 and the interconnect structure 204. In some embodiment, the bonding layer 206 and the dielectric layer 161 comprise a same material. Die connectors 208 may extend through the bonding layer 206 may be electrically connected to the metallization patterns of the interconnect structure 204. In some embodiment, the die connectors 208 and the conductive features 162 comprise a same material.

The top integrated circuit dies 200 may be bonded to the top interposer 150 by placing the top integrated circuit dies 200 using a pick-and-place process or the like, then bonding the top integrated circuit dies 200 to the top interposer 150. The bonding layers 206 of the top integrated circuit dies 200 may be directly bonded to the dielectric layer 161 through dielectric-to-dielectric bonding, and the die connectors 208 of the top integrated circuit dies 200 may be directly bonded to respective conductive features 162 through metal-to-metal bonding. The bonding process of the top integrated circuit dies 200 and the top interposer 150 may be a same or similar to the bonding process of the bottom integrated circuit dies 100 and the bottom interposer 50 described above. The bottom interposer 50 and the top interposer 150 may enable communication among the bottom integrated circuit dies 100 and the top integrated circuit dies 200 as well as reduce die-to-die routing distance among the bottom integrated circuit dies 100 and the top integrated circuit dies 200, thereby improving the signal integrity, the power integrity, and the overall performance of the complete semiconductor package during operation.

Figure 6:
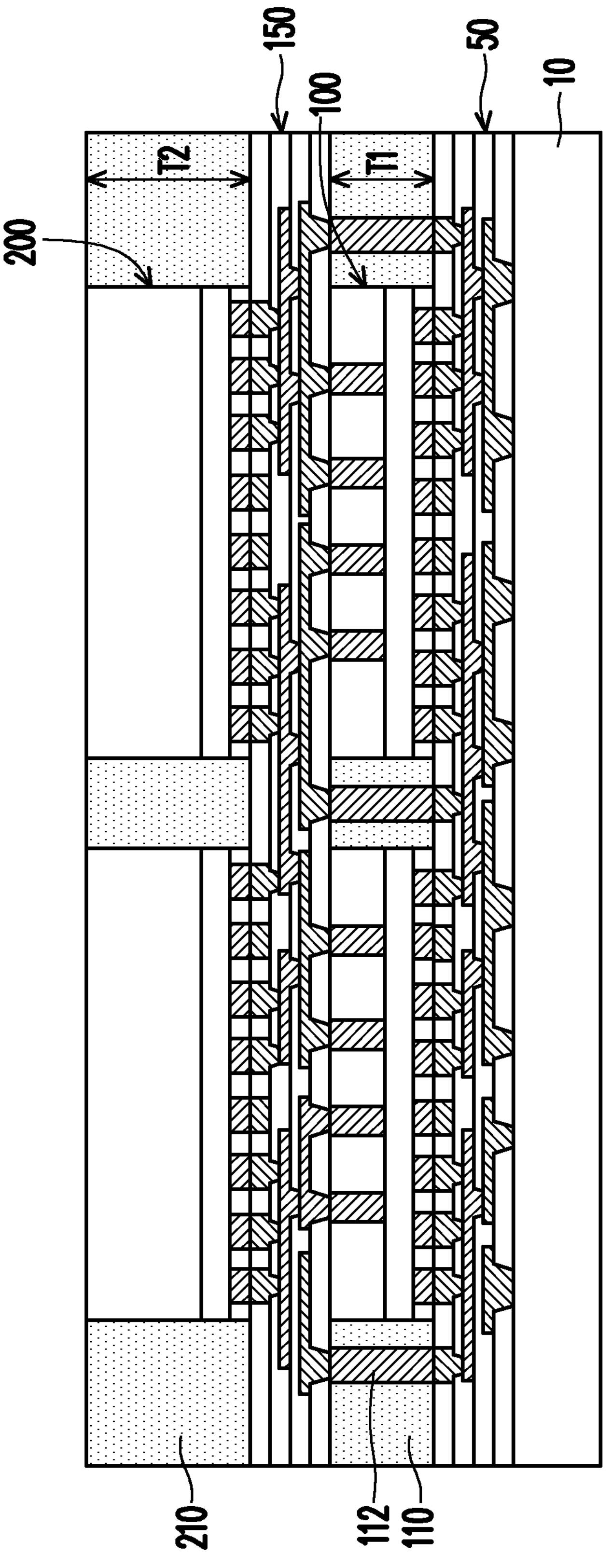

In FIG. 6, a top gap-fill layer 210 is formed on the top interposer 150 surrounding the top integrated circuit dies 200. The top gap-fill layer 210 may be also referred to as an encapsulant. The top gap-fill layer 210 may be along sidewalls of the top integrated circuit dies 200. The top gap-fill layer 210 may comprise a same or similar material and may be formed by a same or similar method as described above with respect to the bottom gap-fill layer 110. In some embodiments, the dielectric material of the top gap-fill layer 210 comprises an inorganic dielectric material, such as a silicon-based dielectric material (e.g., silicon oxide, silicon nitride, silicon carbide, silicon oxynitride, silicon oxycarbide, silicon oxycarbonitride, or the like), which may be formed by a suitable deposition process, such as CVD, ALD, or the like. In some embodiments, dielectric material of the top gap-fill layer 210 comprises an organic dielectric material, such as a polymer-based dielectric material (e.g., molding compound, epoxy, resin, or the like), which may be formed by a suitable molding process, such as compression molding, transfer molding, or the like.

In some embodiments, the top gap-fill layer 210 and the bottom gap-fill layer 110 both comprise an inorganic dielectric material, such as an oxide. In some embodiments, the top gap-fill layer 210 comprises an inorganic dielectric material, such as an oxide, and the bottom gap-fill layer 110 comprises an organic dielectric material, such as a molding compound. In some embodiments, the top gap-fill layer 210 comprises an organic dielectric material, such as a molding compound, and the bottom gap-fill layer 110 comprises an inorganic dielectric material, such as an oxide. In some embodiments, the top gap-fill layer 210 and the bottom gap-fill layer 110 both comprise an organic dielectric material, such as a molding compound.

Initially, the top gap-fill layer 210 may cover the back sides of the top integrated circuit dies 200. A thinning process may be performed to remove the excess top gap-fill layer 210 and portions of the semiconductor substrates 102. The thinning process may be a CMP process, a grinding process, an etch-back process, combinations thereof, or the like. As a result, the surfaces of the top gap-fill layer 210 and the top integrated circuit dies 200 are substantially coplanar or level within process variations. The top gap-fill layer 210 and the top integrated circuit dies 200 may have a same thickness T2 in a range of about 20 μm to about 500 μm. In some embodiments, thickness T2 of the top integrated circuit dies 200 is larger than the thickness T1 of the bottom integrated circuit dies 100, which may result in an improved heat dissipation of the complete semiconductor package during operation.

Figure 7:
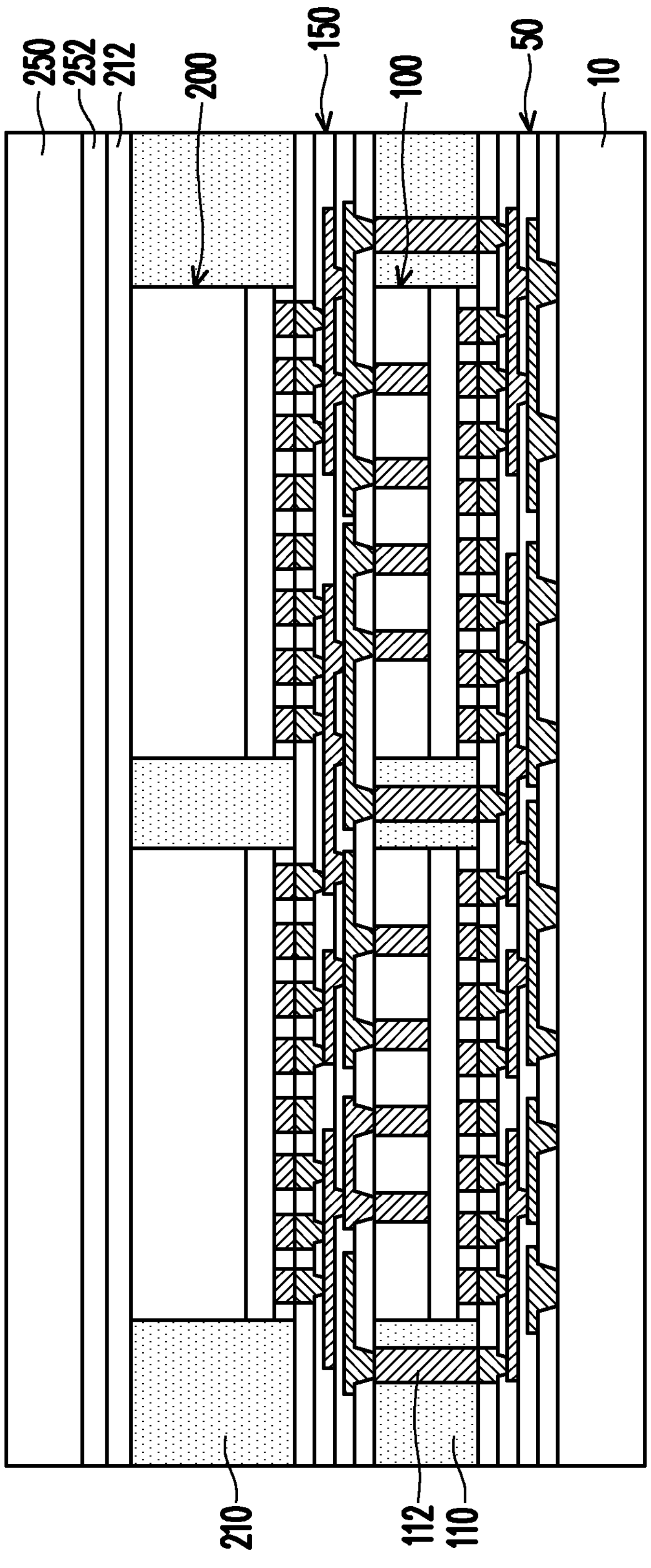

In FIG. 7, a second carrier 250 is bonded to the top integrated circuit dies 200 and the top gap-fill layer 210. The second carrier 250 may be a semiconductor carrier, a glass carrier, a ceramic carrier, or the like. The second carrier 250 may be have a same or similar size as the first carrier 10. The second carrier 250 may be bonded to the top integrated circuit dies 200 and the top gap-fill layer 210 using a bonding layer 212 and a bonding layer 252. In some embodiments, the bonding layer 212 and the bonding layer 252 may each comprise a dielectric material, such as silicon dioxide or the like, and may be formed by a suitable deposition process such as CVD, ALD, or the like. In such embodiments, the bonding process between the bonding layer 212 and the bonding layer 252 may be same or similar to the bonding process between the dielectric layer 161 and the bonding layer 206 described with respect to FIG. 5. In some embodiments, the bonding layer 212 may be an adhesive, such as a die-attach-film (DAF), and the bonding layer 252 may be a release film, such as a polymer-based light-to-heat-conversion (LTHC) film.

Figure 8:
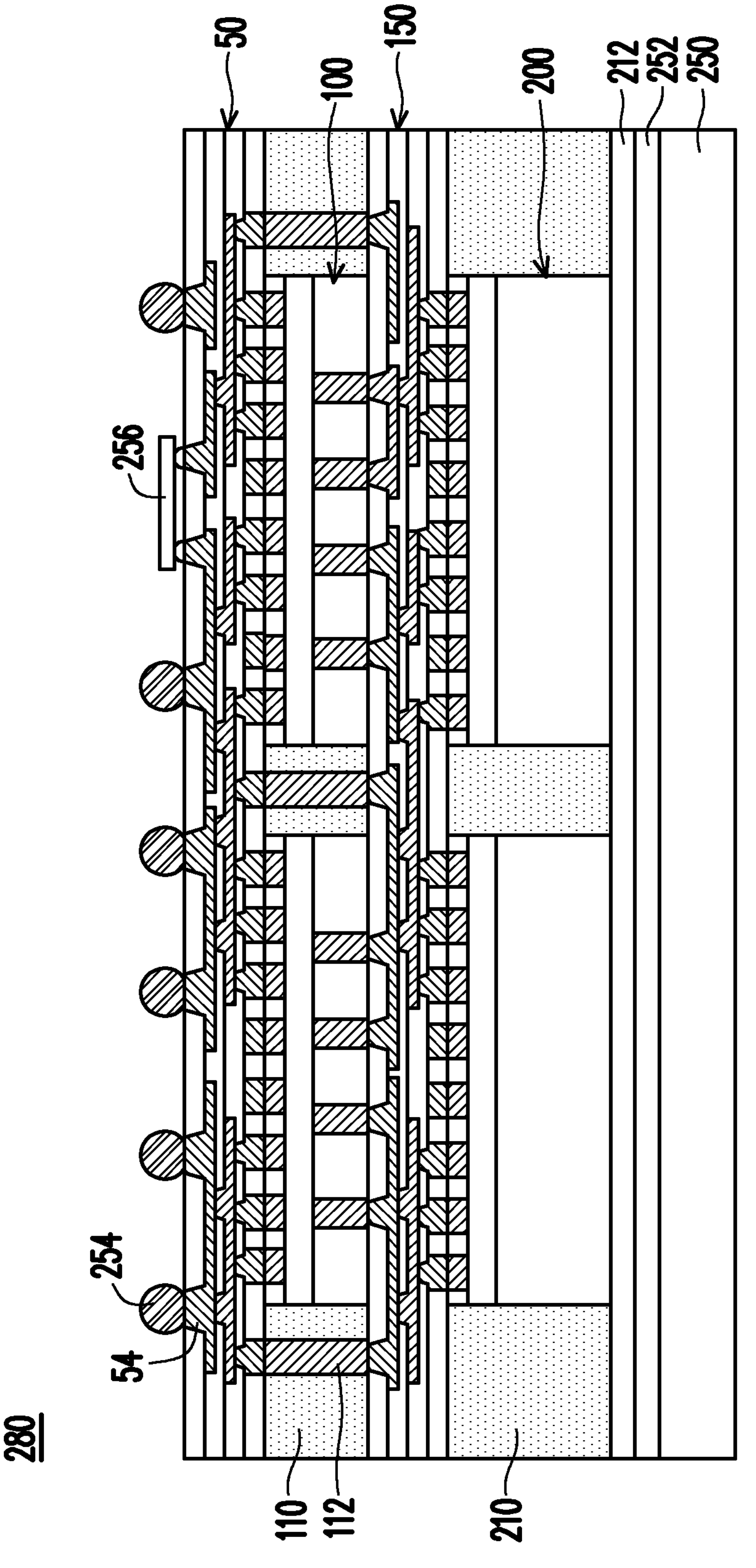

In FIG. 8, the first carrier 10 is removed to expose surfaces of the conductive features 54, which may act as under-bump metallizations (UBMs), and electrical connectors 254 are formed on the exposed surfaces of the conductive features 54. The electrical connectors 254 may allow other devices to be electrically connected to the bottom interposer 50. The electrical connectors 254 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, the electrical connectors 254 comprise a conductive material such as solder, copper, aluminum, gold, nickel, silver, palladium, tin, the like, or a combination thereof. The electrical connectors 254 may be formed by initially forming a layer of solder through evaporation, electroplating, printing, solder transfer, ball placement, or the like. Once the layer of solder has been formed on the structure, a reflow may be performed to shape the solder into the desired bump shapes. In some embodiments, the electrical connectors 254 comprise metal pillars, such as a copper pillar, formed by a sputtering, printing, electroplating, electroless plating, CVD, or the like, which are solder free and have substantially vertical sidewalls. A metal cap layer may be formed on top of the metal pillars. The metal cap layer may include nickel, tin, tin-lead, gold, silver, palladium, indium, nickel-palladium-gold, nickel-gold, the like, or a combination thereof, and may be formed by a plating process. In some embodiments, one or more integrated passive devices 256 may be bonded to the electrical connectors 254. The integrated passive devices 256 may be capacitors, resistors, inductors, or the like.

Figure 9:
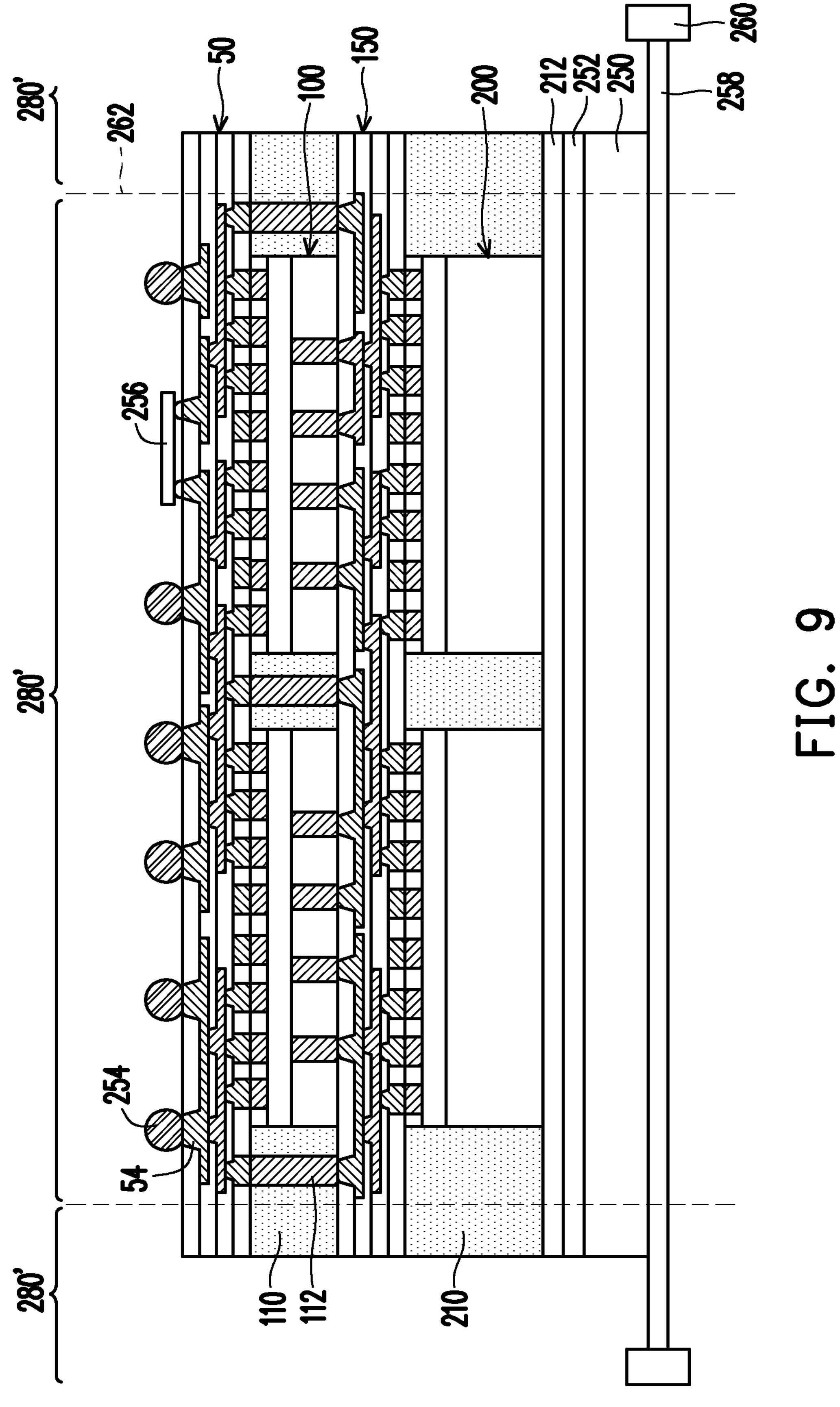

The processes discussed above may be performed using wafer-level processing. The second carrier 250 may be a wafer and may include many structures (not separately illustrated) similar to the one illustrated in FIG. 8. As such, the structure shown in FIG. 8 may be referred to as a wafer structure 280 and may be singulated in a subsequent process. In FIG. 9, the wafer structure 280 is singulated to form individual integrated circuit package components 280'. The wafer structure 280 may be placed on a tape 258 supported by a frame 260. The wafer structure 280 may be then singulated along scribe lines 262, so that the wafer structure 280 may be separated into individual integrated circuit package components 280'. The singulation process may include a sawing process, a laser cutting process, or the like. A cleaning process or rinsing process may be performed after the singulation process.

Figure 10:
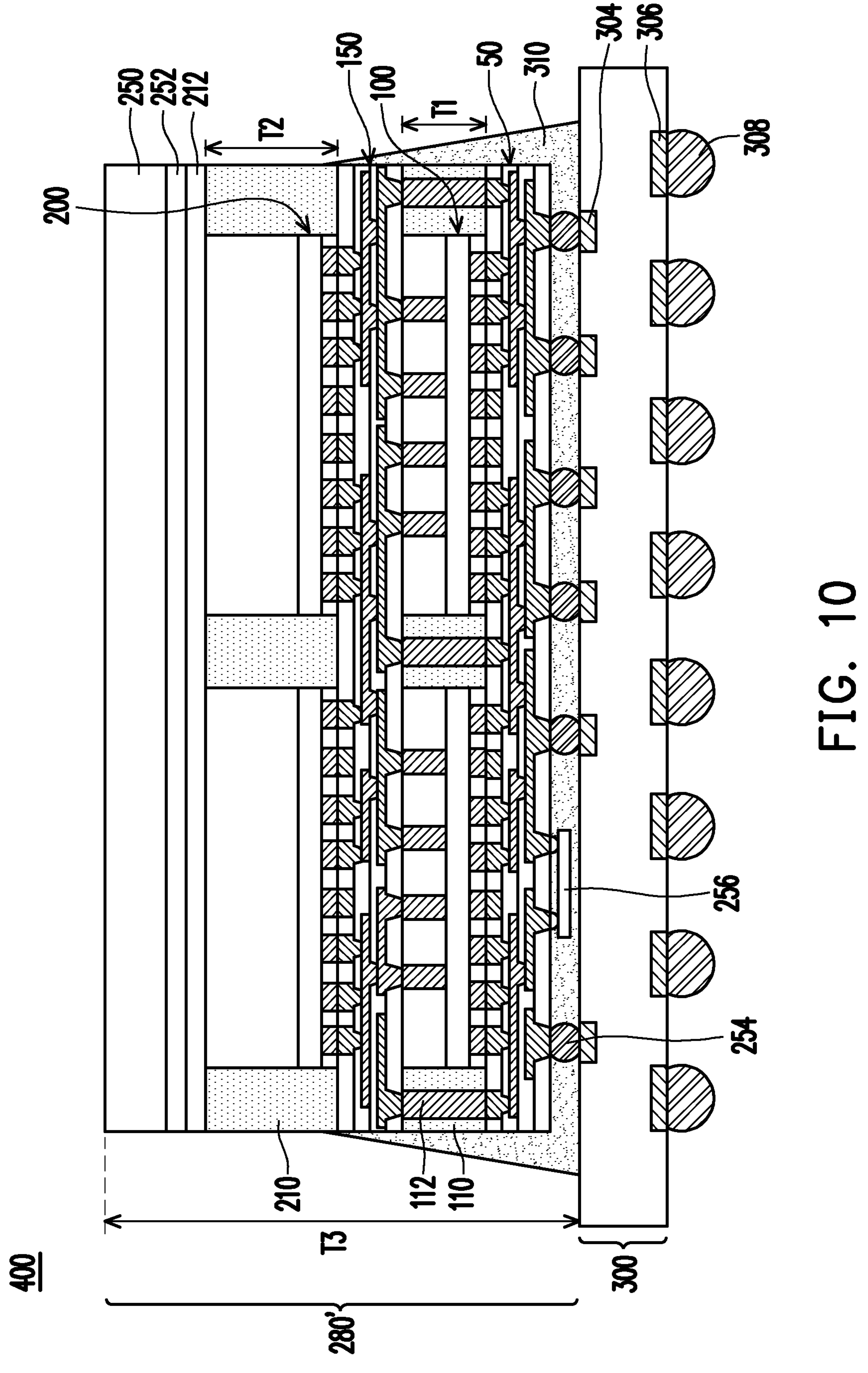

In FIG. 10, the integrated circuit package component 280' is bonded to a package substrate 300 and an underfill 310 is formed between the integrated circuit package component 280' and the package substrate 300. The package substrate 300 may comprise bonding pads 304 on a first side and bonding pads 306 on a second side. The package substrate 300 may comprise metallization layers and vias (not separately illustrated) physically and electrically connected to the bonding pads 304 and the bonding pads 306. The electrical connectors 254 of the integrated circuit package component 280' may be connected to the bonding pads 304. Electrical connectors 308 may be disposed on the bonding pads 306, which may be connected to other electrical devices. The electrical connectors 308 may comprise same or similar materials and may be formed by same or similar methods as described above with respect to the electrical connectors 254. In some embodiments, the package substrate 300 includes active and passive devices (not separately illustrated), such as transistors, capacitors, resistors, combinations thereof, or the like. The metallization layers may be formed over the active and passive devices and may connect the active and passive devices to form functional circuitry. During the bonding process the electrical connectors 254 may be reflowed to bond the integrated circuit package component 280' to the bonding pads 304. The electrical connectors 254 may electrically and physically connect the package substrate 300 to the integrated circuit package component 280'.

The underfill 310 may surround the electrical connectors 254 and protect the joints resulting from the reflowing of the electrical connectors 254. The underfill 310 may encircle the integrated circuit package component 280' in a top-down view and may be along sidewalls of the bottom interposer 50, the bottom gap-fill layer 110, the top interposer 150, and the top gap-fill layer 210. The underfill 310 may be formed by a capillary flow process after the integrated circuit package component 280' is bonded to the package substrate 300 or by a suitable deposition method before the integrated circuit package component 280' is bonded to the package substrate 300. The underfill 310 may be subsequently cured. The integrated circuit package component 280' may have a thickness T3 in range of about 0.7 mm to about 1 mm. The thickness T3 may be a distance from a top surface of the second carrier 250 to a top surface of the package substrate 300. The structure shown in FIG. 10 may be collectively referred to as semiconductor package 400.

Figure 11:
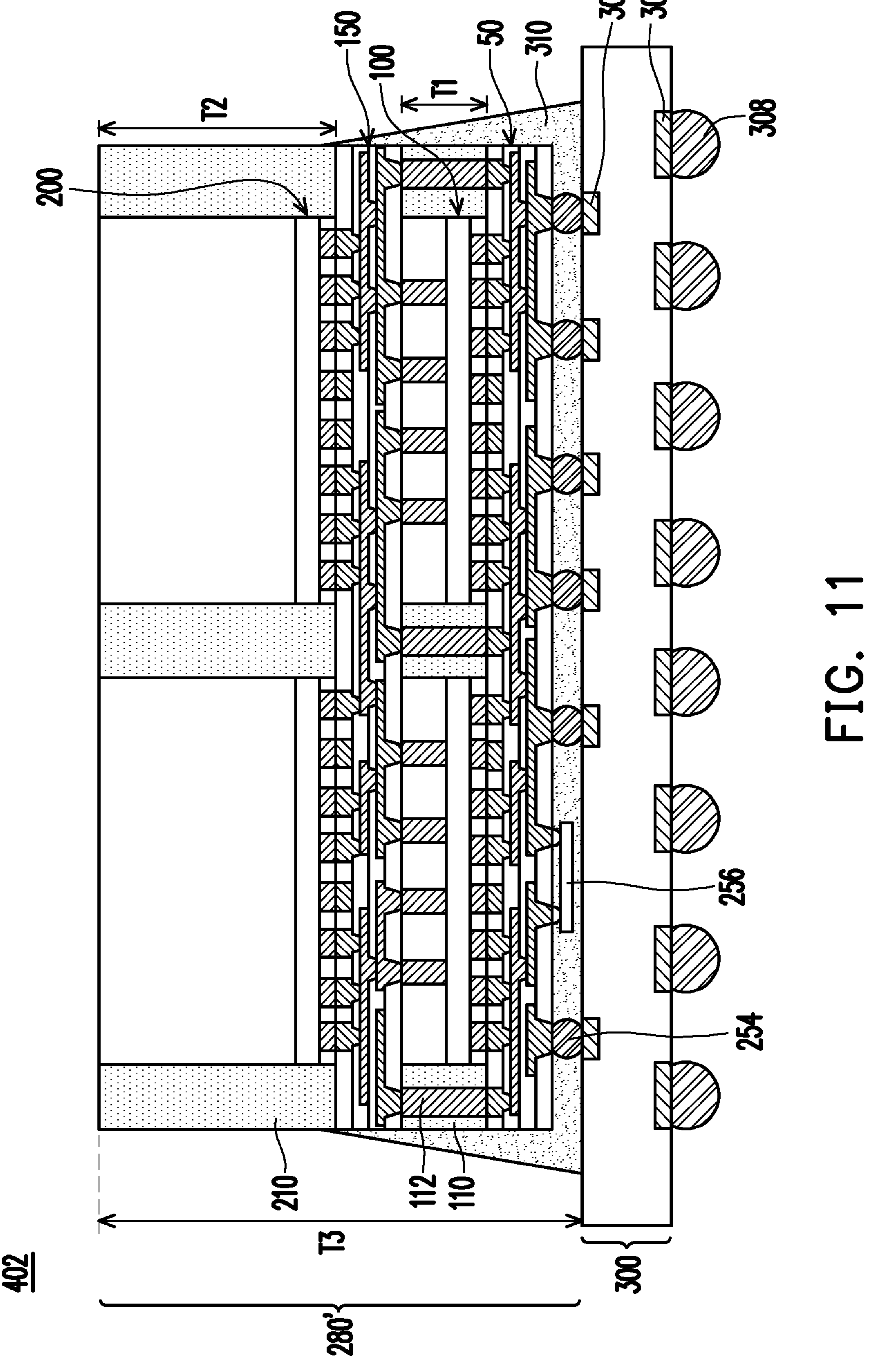
FIGS. 11 and 12 illustrate cross-sectional views of various semiconductor packages in accordance with some embodiments.

FIG. 11 shows a semiconductor package 402 with a structure similar to the semiconductor package 400 shown in FIG. 10, wherein like reference numerals refer to like elements. FIG. 11 illustrates the embodiments where the second carrier 250, the bonding layer 212, and the bonding layer 252 are removed. In the embodiments where the bonding layer 212 and the bonding layer 252 comprise dielectric materials, the second carrier 250, the bonding layer 212, and the bonding layer 252 may be removed by a thinning process, such as a CMP process, a grinding process, an etch-back process, combinations thereof, or the like. In the embodiments where the bonding layer 212 may is an adhesive and the bonding layer 252 is a release film, the second carrier 250, the bonding layer 212, and the bonding layer 252 may be removed by projecting a light beam, such as a laser beam or a UV light beam on the bonding layer 252 so that the release film decomposes upon exposure to the light beam. The second carrier 250, the bonding layer 212, and the bonding layer 252 may be removed before or after the singulation process illustrated in FIG. 9. The bottom gap-fill layer 110 and the bottom integrated circuit dies 100 may have a same thickness T1 in a range of about 15 μm to about 30 μm. The top gap-fill layer 210 and the top integrated circuit dies 200 may have a same thickness T2 in a range of about 20 μm to about 500 μm. In some embodiments, thickness T2 of the top integrated circuit dies 200 is larger than the thickness T1 of the bottom integrated circuit dies 100, which may result in an improved heat dissipation of the semiconductor package 402 during operation. The integrated circuit package component 280' may have a thickness T3 in range of about 0.7 mm to about 1 mm. The thickness T3 may be a distance from a top surface of the second carrier 250 to a top surface of the package substrate 300.

Figure 12:
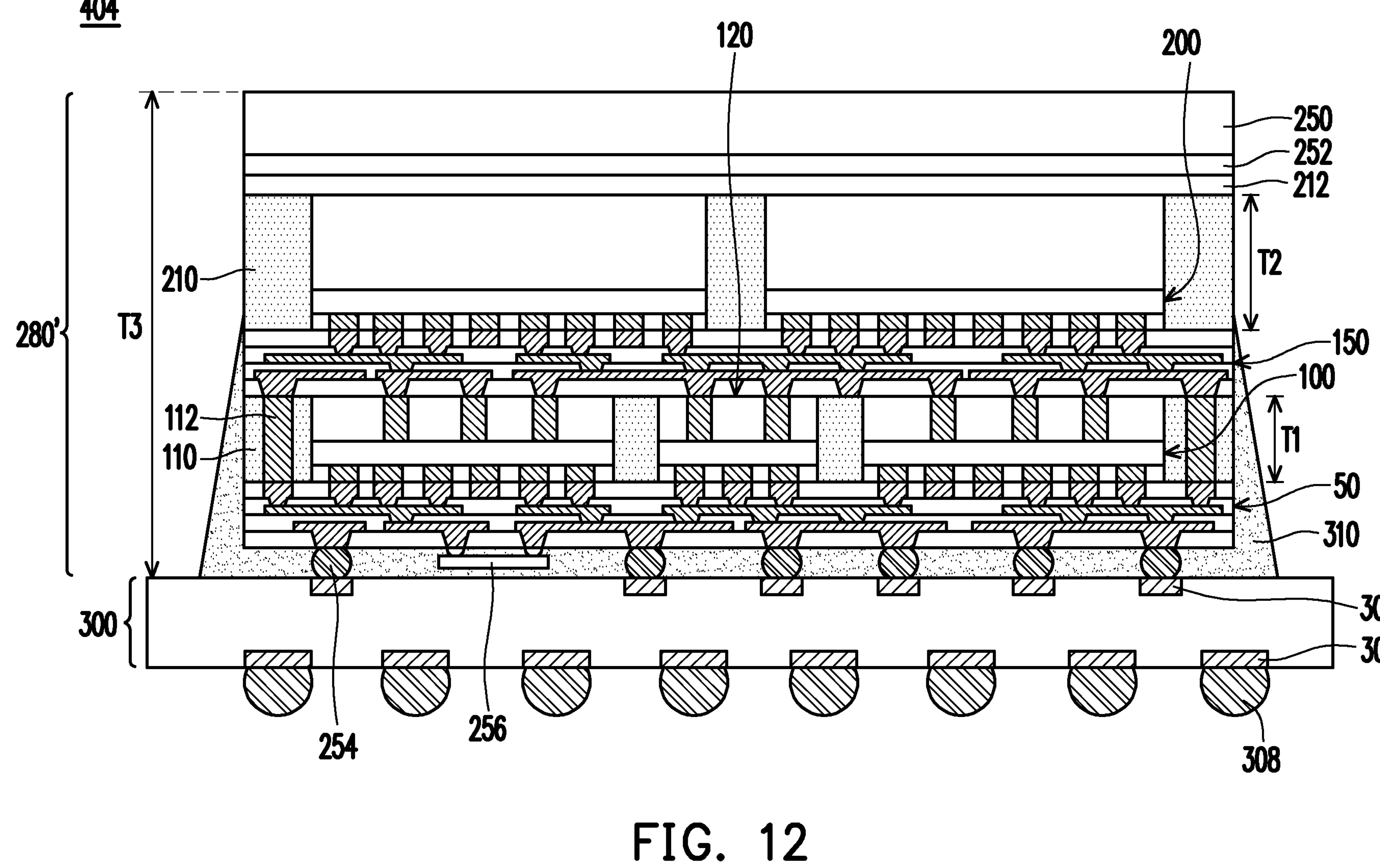

FIG. 12 shows a semiconductor package 404 with a structure similar to the semiconductor package 400 shown in FIG. 10, wherein like reference numerals refer to like elements. FIG. 12 illustrates the embodiments where one or more bridge dies 120 are disposed beside the bottom integrated circuit dies 100. The one or more bridge dies 120 may have similar structures as the bottom integrated circuit dies 100, although the one or more bridge dies 120 may be without devices disposed at active surfaces of semiconductor substrates that face interconnect structures of the one or more bridge dies 120. The one or more bridge dies 120 may be bonded to the bottom interposer 50 by dielectric-to-dielectric and metal-to-metal bonding. The one or more bridge dies 120 may extend through the bottom gap-fill layer 110 and may be physically and electrically connected to the bottom interposer 50 and the top interposer 150. As a result, the one or more bridge dies 120 may be electrically connected to the bottom integrated circuit dies 100 and the top integrated circuit dies 200 and may improve communication among the bottom integrated circuit dies 100 and the top integrated circuit dies 200. The bottom gap-fill layer 110, the bottom integrated circuit dies 100, and the one or more bridge dies 120 may have a same thickness T1 in a range of about 15 μm to about 30 μm. The top gap-fill layer 210 and the top integrated circuit dies 200 may have a same thickness T2 in a range of about 20 μm to about 500 μm. In some embodiments, thickness T2 of the top integrated circuit dies 200 is larger than the thickness T1 of the bottom integrated circuit dies 100, which may result in an improved heat dissipation of the semiconductor package 404 during operation. The integrated circuit package component 280' may have a thickness T3 in range of about 0.7 mm to about 1 mm. The thickness T3 may be a distance from a top surface of the second carrier 250 to a top surface of the package substrate 300.

The embodiments of the present disclosure have some advantageous features. By utilizing the dielectric-to-dielectric and metal-to-metal bonding mechanism to bond the bottom integrated circuit dies 100 to the bottom interposer 50 as well as the top integrated circuit dies 200 to the top interposer 150, the densities of the conductive features 62 and the conductive features 162 may be increased. By utilizing the bottom interposer 50 and the top interposer 150 to facilitate communication among the bottom integrated circuit dies 100 and the top integrated circuit dies 200, the die-to-die routing distance among the bottom integrated circuit dies 100 and the top integrated circuit dies 200 may be reduced. As a result, the signal integrity, the power integrity, and the overall performance of the semiconductor package 400, the semiconductor package 402, and the semiconductor package 404 during operation may be improved.

In an embodiment, a semiconductor package includes a first interposer; a first semiconductor die including a first substrate and a first bonding layer on a first side of the first substrate, wherein a plurality of first bonding pads are disposed in the first bonding layer, and wherein the first bonding layer and the plurality of first bonding pads are bonded to the first interposer by metal-to-metal bonding and dielectric-to-dielectric bonding; a second interposer on a second side of the first substrate, the second side of the first substrate being opposite to the first side of the first substrate; and a second semiconductor die including a second substrate and a second bonding layer on a first side of the second substrate, wherein a plurality of second bonding pads are disposed in the second bonding layer, wherein the second bonding layer and the plurality of second bonding pads are bonded to the second interposer by metal-to-metal bonding and dielectric-to-dielectric bonding, and wherein the second interposer is between the first semiconductor die and the second semiconductor die. In an embodiment, the semiconductor package further includes a first encapsulant surrounding the first semiconductor die and a second encapsulant surrounding the second semiconductor die. In an embodiment, the first encapsulant and the second encapsulant each includes an oxide. In an embodiment, the first encapsulant includes a molding compound and the second encapsulant includes an oxide. In an embodiment, the first encapsulant includes an oxide and the second encapsulant includes a molding compound. In an embodiment, the first encapsulant and the second encapsulant each includes a molding compound. In an embodiment, the second semiconductor die has a larger thickness than the first semiconductor die. In an embodiment, the semiconductor package further includes an integrated passive device on the first interposer, wherein the first interposer is between the first semiconductor die and the integrated passive device.

In an embodiment, a semiconductor package includes a package substrate; a first interposer, wherein a first side of the first interposer is bonded to the package substrate; a first semiconductor die bonded to a second side of the first interposer, the second side of the first interposer being opposite to the first side of the first interposer, wherein the first semiconductor die is bonded to the first interposer by metal-to-metal bonding and dielectric-to-dielectric bonding; a first encapsulant along sidewalls of the first semiconductor die; a second interposer, wherein a first side of the second interposer is in contact with the first semiconductor die and the first encapsulant, and wherein the first semiconductor die is between the first interposer and the second interposer; a second semiconductor die bonded to a second side of the second interposer, the second side of the second interposer being opposite to the first side of the second interposer, wherein the second semiconductor die is bonded to the second interposer by metal-to-metal bonding and dielectric-to-dielectric bonding; a second encapsulant along sidewalls of the second semiconductor die; and a carrier on the second semiconductor die and the second encapsulant. In an embodiment, the first encapsulant and the second encapsulant include a same inorganic dielectric material. In an embodiment, the first encapsulant includes an inorganic dielectric material and the second encapsulant includes an organic dielectric material. In an embodiment, the semiconductor package further includes a bridge die, wherein the bridge die is between the first interposer and the second interposer, and wherein the bridge die is electrically connected to the first interposer and the second interposer. In an embodiment, the semiconductor package further includes an integrated passive device on the first side of the first interposer.

In an embodiment, a method of manufacturing a semiconductor package includes forming a first interposer on a first carrier; bonding a first semiconductor die to the a first side of the first interposer by metal-to-metal bonding and dielectric-to-dielectric bonding, wherein an active side of the first semiconductor die faces the first interposer; forming a first encapsulant along sidewalls of the first semiconductor die; forming a second interposer on the first semiconductor die and the first encapsulant, wherein the first encapsulant is between the first interposer and the second interposer; bonding a second semiconductor die to the second interposer by metal-to-metal bonding and dielectric-to-dielectric bonding, and wherein an active side of the second semiconductor die faces the second interposer, wherein the second interposer is between the first semiconductor die and the second semiconductor die; and forming a second encapsulant along sidewalls of the second semiconductor die. In an embodiment, the method further includes removing the first carrier; attaching a second side of the first interposer to a package substrate, the second side of the first interposer being opposite to the first side of the first interposer; and placing an underfill between the first interposer and the package substrate. In an embodiment, the method further includes bonding an integrated passive device to the second side of the first interposer. In an embodiment, the second interposer completely separates the first encapsulant and the second encapsulant. In an embodiment, the method further includes bonding a bridge die to the first side of the first interposer by metal-to-metal bonding and dielectric-to-dielectric bonding. In an embodiment, the second encapsulant includes a polymer. In an embodiment, the second encapsulant has a larger thickness than the first encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:

a first interposer;

a first semiconductor die comprising a first substrate and a first bonding layer on a first side of the first substrate, wherein a plurality of first bonding pads are disposed in the first bonding layer, and wherein the first bonding layer and the plurality of first bonding pads are bonded to the first interposer by metal-to-metal bonding and dielectric-to-dielectric bonding;

a second interposer on a second side of the first substrate, the second side of the first substrate being opposite to the first side of the first substrate;

a second semiconductor die comprising a second substrate and a second bonding layer on a first side of the second substrate, wherein a plurality of second bonding pads are disposed in the second bonding layer, wherein the second bonding layer and the plurality of second bonding pads are bonded to the second interposer by metal-to-metal bonding and dielectric-to-dielectric bonding, and wherein the second interposer is between the first semiconductor die and the second semiconductor die;

a first dielectric layer contacting a second side of the second substrate, the second side of the second substrate being opposite to the first side of the second substrate;

a second dielectric layer bonded to the first dielectric layer by dielectric-to-dielectric bonding; and a semiconductor layer contacting the second dielectric layer.

2. The semiconductor package of claim 1, further comprising a first encapsulant surrounding the first semiconductor die and a second encapsulant surrounding the second semiconductor die.

3. The semiconductor package of claim 2, wherein the first encapsulant and the second encapsulant each comprises an oxide.

4. The semiconductor package of claim 2, wherein the first encapsulant comprises a molding compound and the second encapsulant comprises an oxide.

5. The semiconductor package of claim 2, wherein the first encapsulant comprises an oxide and the second encapsulant comprises a molding compound.

6. The semiconductor package of claim 2, wherein the first encapsulant and the second encapsulant each comprises a molding compound.

7. The semiconductor package of claim 1, wherein the second semiconductor die has a larger thickness than the first semiconductor die, wherein the first interposer is spaced apart from the second interposer by a first vertical distance, wherein the second interposer is spaced apart from the first dielectric layer by a second vertical distance, and wherein the second vertical distance is larger than the first vertical distance.

8. The semiconductor package of claim 1, further comprising an integrated passive device on the first interposer, wherein the first interposer is between the first semiconductor die and the integrated passive device.

9. A semiconductor package comprising:

a package substrate;

a first interposer, wherein a first side of the first interposer is bonded to the package substrate;

a first semiconductor die bonded to a second side of the first interposer, the second side of the first interposer being opposite to the first side of the first interposer, wherein the first semiconductor die is bonded to the first interposer by metal-to-metal bonding and dielectric-to-dielectric bonding;

a first encapsulant along sidewalls of the first semiconductor die;

a second interposer, wherein a first side of the second interposer is in contact with the first semiconductor die and the first encapsulant, and wherein the first semiconductor die is between the first interposer and the second interposer;

a second semiconductor die bonded to a second side of the second interposer, the second side of the second interposer being opposite to the first side of the second interposer, wherein the second semiconductor die is bonded to the second interposer by metal-to-metal bonding and dielectric-to-dielectric bonding;

a second encapsulant along sidewalls of the second semiconductor die; and a semiconductor layer on the second semiconductor die and the second encapsulant, wherein the semiconductor layer is a single-material layer.

10. The semiconductor package of claim 9, wherein the first encapsulant and the second encapsulant comprise a same inorganic dielectric material.

11. The semiconductor package of claim 9, wherein the first encapsulant comprises an inorganic dielectric material and the second encapsulant comprises an organic dielectric material.

12. The semiconductor package of claim 9, further comprising a bridge die beside the first semiconductor die, wherein the bridge die is between the first interposer and the second interposer, and wherein the bridge die is electrically connected to the first semiconductor die, the second semiconductor die, the first interposer, and the second interposer.

13. The semiconductor package of claim 9, further comprising an integrated passive device on the first side of the first interposer.

14. A method of manufacturing a semiconductor package, the method comprising:

forming a first interposer on a first carrier;

bonding a first semiconductor die to a first side of the first interposer by metal-to-metal bonding and dielectric-todielectric bonding, wherein an active side of the first semiconductor die faces the first interposer;

forming a first encapsulant along sidewalls of the first semiconductor die;

forming a second interposer on the first semiconductor die and the first encapsulant, wherein the first encapsulant is between the first interposer and the second interposer;

bonding a second semiconductor die to the second interposer by metal-to-metal bonding and dielectric-to-dielectric bonding, and wherein an active side of the second semiconductor die faces the second interposer, wherein the second interposer is between the first semiconductor die and the second semiconductor die;

forming a second encapsulant along sidewalls of the second semiconductor die; and bonding a second carrier over the second semiconductor die and the second encapsulant by a first dielectric layer and a second dielectric layer, wherein the first dielectric layer and the second dielectric layer are between the second carrier and the second semiconductor die, and wherein the first dielectric layer and the second dielectric layer are bonded by dielectric-to-dielectric bonding.

15. The method of claim 14, further comprising:

removing the first carrier;

attaching a second side of the first interposer to a package substrate, the second side of the first interposer being opposite to the first side of the first interposer; and placing an underfill between the first interposer and the package substrate.

16. The method of claim 15, further comprising bonding an integrated passive device to the second side of the first interposer before placing the underfill, wherein the integrated passive device is embedded in the underfill after placing the underfill.

17. The method of claim 14, wherein the second interposer completely separates the first encapsulant and the second encapsulant.

18. The method of claim 14, further comprising bonding a bridge die to the first side of the first interposer by metal-to-metal bonding and dielectric-to-dielectric bonding.

19. The method of claim 14, wherein the second encapsulant comprises a polymer.

20. The method of claim 14, wherein the second encapsulant has a larger thickness than the first encapsulant.

* * * * *